(12) United States Patent
Kim et al.

(10) Patent No.: US 8,936,703 B2
(45) Date of Patent: Jan. 20, 2015

(54) METHODS TO FABRICATE NON-METAL FILMS ON SEMICONDUCTOR SUBSTRATES USING PHYSICAL VAPOR DEPOSITION

(75) Inventors: Jin Hyun Kim, San Jose, CA (US); Michael Nam, San Jose, CA (US); Jae Yeol Park, San Ramon, CA (US); Jonggu Park, Gwangju-Si (KR)

(73) Assignee: Semicat, Inc., Fremont, CA (US)

(*) Notice: Subject to any disclaimer, the term of this patent is extended or adjusted under 35 U.S.C. 154(b) by 590 days.

(21) Appl. No.: 12/551,379

(22) Filed: Aug. 31, 2009

(65) Prior Publication Data

US 2011/0048928 A1 Mar. 3, 2011

(51) Int. Cl.
| | |
|---|---|
| C23C 14/00 | (2006.01) |
| C23C 14/32 | (2006.01) |
| H01L 45/00 | (2006.01) |
| C23C 14/56 | (2006.01) |
| C23C 14/35 | (2006.01) |
| C23C 14/06 | (2006.01) |

(52) U.S. Cl.
CPC .............. *C23C 14/35* (2013.01); *H01L 45/144* (2013.01); *C23C 14/564* (2013.01); *H01L 45/1625* (2013.01); *H01L 45/1233* (2013.01); *H01L 45/06* (2013.01); *C23C 14/0623* (2013.01)
USPC .................................. 204/192.25; 204/192.15

(58) Field of Classification Search
USPC ........................................ 204/192.25, 192.15
See application file for complete search history.

(56) References Cited

U.S. PATENT DOCUMENTS

| | | | | |
|---|---|---|---|---|
| 5,006,219 A | * | 4/1991 | Latz et al. ................ | 204/298.16 |
| 6,077,403 A | * | 6/2000 | Kobayashi et al. ...... | 204/192.12 |
| 6,296,747 B1 | | 10/2001 | Tanaka | |
| 6,361,667 B1 | | 3/2002 | Kobayashi et al. | |
| 6,376,391 B1 | * | 4/2002 | Olson et al. .................... | 438/758 |
| 2002/0144901 A1 | | 10/2002 | Nulman et al. | |
| 2004/0168771 A1 | | 9/2004 | Mitrovic | |
| 2005/0103620 A1 | | 5/2005 | Chistyakov | |
| 2005/0236377 A1 | | 10/2005 | Hoffman et al. | |
| 2005/0263390 A1 | | 12/2005 | Gung et al. | |
| 2006/0040485 A1 | | 2/2006 | Lee et al. | |
| 2006/0284158 A1 | | 12/2006 | Lung et al. | |
| 2008/0099326 A1 | | 5/2008 | Ye et al. | |
| 2008/0135401 A1 | * | 6/2008 | Kadlec et al. ............ | 204/192.13 |

(Continued)

FOREIGN PATENT DOCUMENTS

EP 1088329 B1 10/2004

OTHER PUBLICATIONS

Copenheaver, Blaine R.; Notification of the Transmittal of the International Search Report and Written Opinion of the International Searching Authority, or the Declaration; International Application No. PCT/US2010/046813; Date of Mailing Oct. 21, 2010; Form PCT/ISA/220 (1 page); Form PCT/ISA/210 (2 pages); Form PCT/ISA/237 (8 pages).

(Continued)

*Primary Examiner* — Keith Hendricks
*Assistant Examiner* — Ibrahime A Abraham
(74) *Attorney, Agent, or Firm* — Kokka & Backus, PC

(57) ABSTRACT

Embodiments of the invention relate generally to semiconductor device fabrication and processes, and more particularly, to methods for implementing arrangements of magnetic field generators configured to facilitate physical vapor deposition ("PVD") and/or for controlling impedance matching associated with a non-metal-based plasma used to modify a non-metal film, such as a chalcogenide-based film.

9 Claims, 9 Drawing Sheets

(56) References Cited

U.S. PATENT DOCUMENTS

2008/0142359 A1* 6/2008 Gopalraja et al. ....... 204/298.16
2009/0107834 A1 4/2009 Ye et al.

OTHER PUBLICATIONS

Copenheaver, Blaine R.; Notification of the Transmittal of the International Search Report and Written Opinion of the International Searching Authority, or the Declaration; International Application No. PCT/US2010/046864; Date of Mailing Nov. 8, 20010; Form PCT/ISA/220 (1 page); Form PCT/ISA/210 (2 pages); Form PCT/ISA/237 (9 pages); Search History (6 pages).

Ibrahirrie A. Abraham, USPTO Final Office Action, U.S. Appl. No. 12/551,356, Date of Mailing Nov. 27, 2013.

Ibrahime A. Abraham, USPTO Non-Final Office Action, U.S. Appl. No. 12/551,356, Date of Mailing Apr. 24, 2013.

Ibrahirne A. Abraham, USPTO Final Office Action, U.S. Appl. No. 12/551,356, Date of Mailing Jul. 13, 2012.

Ibrahime A. Abraham, USPTO Non-Final Office Action, U.S. Appl. No. 12/551,356, Date of Mailing Feb. 7, 2012.

\* cited by examiner

US 8,936,703 B2

METHODS TO FABRICATE NON-METAL FILMS ON SEMICONDUCTOR SUBSTRATES USING PHYSICAL VAPOR DEPOSITION

CROSS REFERENCE TO RELATED APPLICATIONS

This application is related to U.S. Nonprovisional application Ser. No. 12/551,356, filed concurrently, which is hereby incorporated by reference for all purposes.

BRIEF DESCRIPTION OF THE INVENTION

Embodiments of the invention relate generally to semiconductor device fabrication and processes, and more particularly, to methods for implementing arrangements of magnetic field generators configured to facilitate physical vapor deposition ("PVD") and/or for controlling impedance matching associated with a non-metal-based plasma used to modify a non-metal film, such as a chalcogenide-based film.

BACKGROUND OF THE INVENTION

Traditional techniques for fabricating semiconductors include chemical vapor deposition ("CVD"), which is used typically to deposit relatively thin films onto semiconductor substrates to form electronic devices. Generally, CVD provides relatively enhanced step coverage over topologies and features over which a film is deposited. By contrast, other traditional deposition techniques may provide less desirable step coverage than CVD. To illustrate, consider the structure in FIG. 1. Diagram 100 includes a semiconductor substrate 140 over which an insulator structure 130, an electrode structure 120 (e.g., a bottom electrode), and insulator structures 110a and 110b are formed consecutively. Less than desirable step coverage in some traditional deposition processes can form voids 112 inadvertently in aperture features between, for example, insulator structures 110a and 110b. Voids 112 may form when vertical features (e.g., trench walls) have less thickness than horizontal features. Such voids 112 can degrade electrical performance of an electronic device, among other things.

While functional, there are a variety of drawbacks associated with CVD process techniques. One drawback is that CVD may generate a relatively significant amount of defects and imperfections in the crystalline structure of the deposited film, thereby degrading electrical performance. Further, CVD processes may use or produce hazardous precursor gases and byproducts, thereby requiring additional processing steps to ensure safety, which, in turn, increases costs and consumes resources. In the semiconductor memory industry, such additional processing steps can increase the cost of a memory device more than otherwise might be the case.

In view of the foregoing, it is be desirable to provide a method for overcoming the drawbacks of the conventional deposition processes to deposit non-metal layers to form, for example, a chalcogenide-based film.

SUMMARY OF THE INVENTION

Embodiments of the invention relate generally to semiconductor device fabrication and processes, and more particularly, to methods for implementing arrangements of magnetic field generators configured to facilitate physical vapor deposition ("PVD") and/or for controlling impedance matching associated with a non-metal-based plasma used to modify a non-metal film, such as a chalcogenide-based film.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings. Note that most of the reference numerals include one or two left-most digits that generally identify the figure that first introduces that reference number.

DETAILED DESCRIPTION

Figure 1:
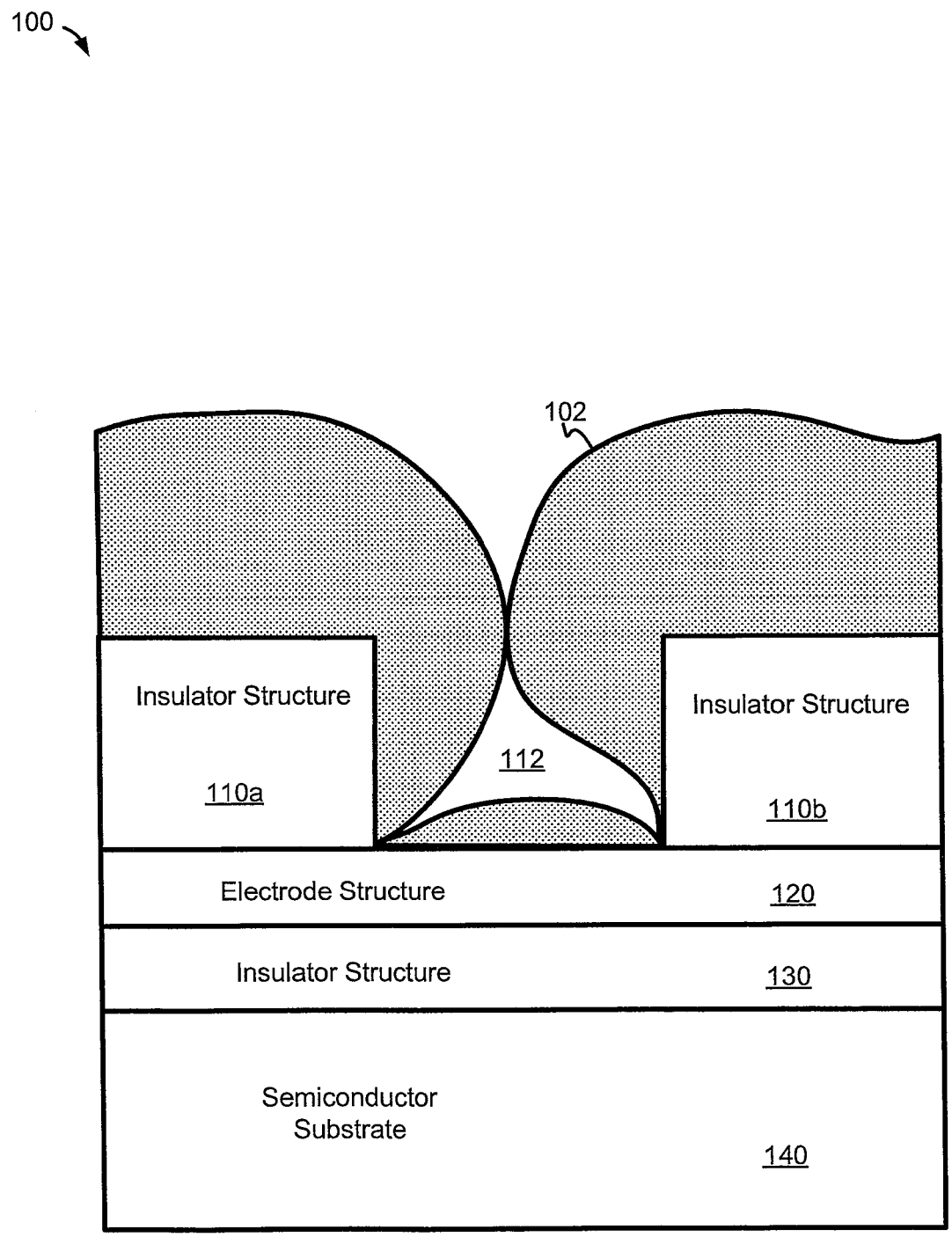
FIG. 1 depicts step coverage of a layer deposited in accordance with conventional wafer fabrication techniques.
Figure 2:
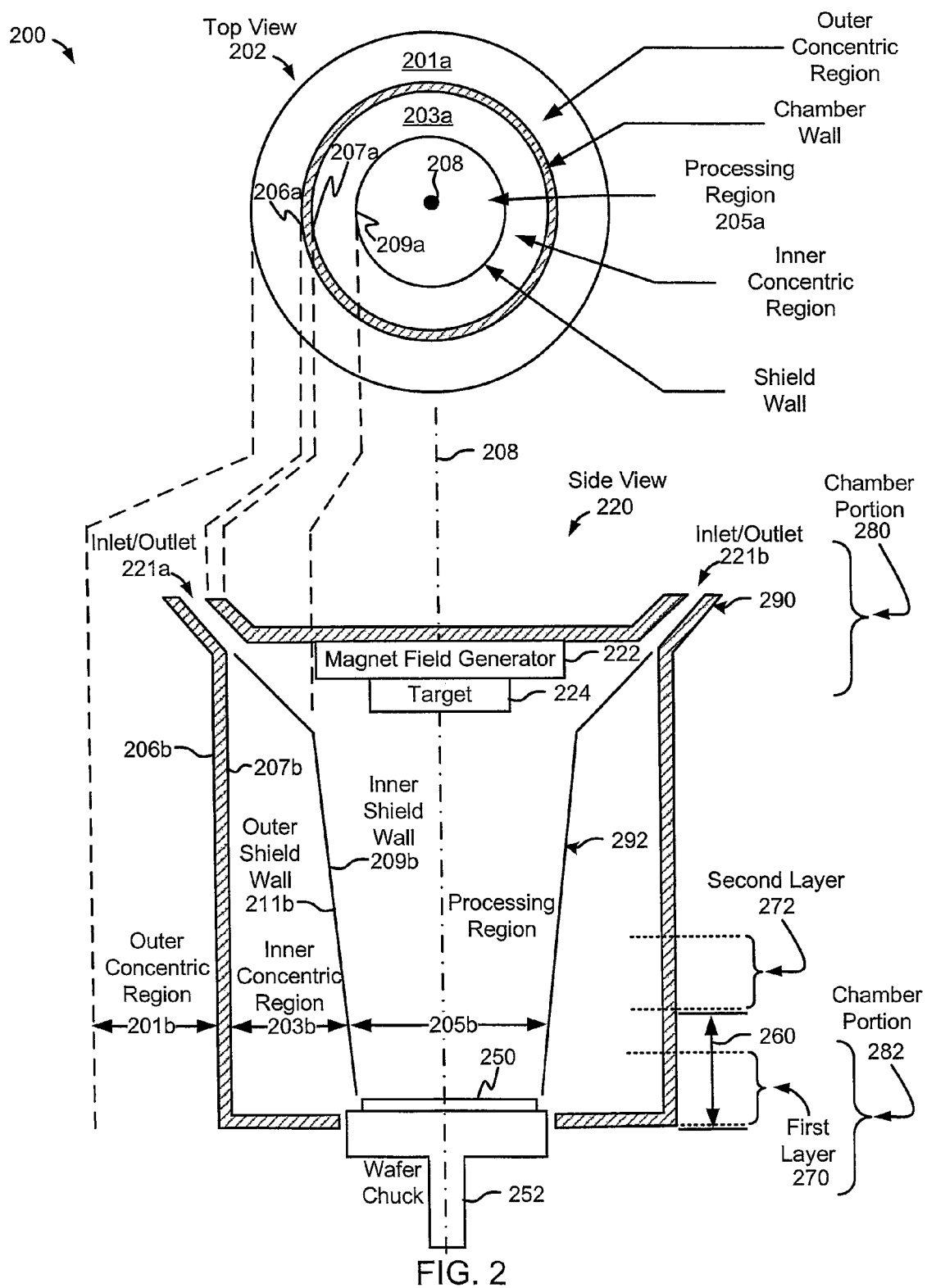
FIG. 2 depicts an example of a system for modifying a non-metal film on a semiconductor substrate in accordance with at least one embodiment of the invention.

FIG. 2 depicts an example of a system for modifying a non-metal film on a semiconductor substrate in accordance with at least one embodiment of the invention. Diagram 200 depicts a top view 202 and a side view 220 of a plasma implementation system. As shown in side view 220, the plasma implementation system can include a chamber 290 having an outer concentric region 201b and an inner concentric region 203b, each being positioned concentrically relative to a centerline 208 passing through a chamber portion 280 and a chamber portion 282. In the example shown, chamber 290 is configured to facilitate plasma processing in a plasma processing region 205b bounded by inner concentric region 203b to modify a semiconductor layer of a non-metal material located, for example, on a substrate 250 in chamber portion 282. In some embodiments, the system shown in FIG. 2 is configured to perform physical vapor deposition ("PVD") to deposit a non-metal material, such as a chalcogenide material, onto a substrate to fabricate semiconductor device structures. As an example, the non-metal material that can be deposited on a substrate may form the memory material for a memory cell, such as a phase change memory cell. In some embodiments, the plasma implementation system can be configured to deposit a layer including germanium, antimony and tellurium ("GST"). In at least one embodiment, the GST can be deposited in the form: $Ge_2Sb_2Te_5$.

According to various embodiments, the plasma implementation system of FIG. 2 can include multiple concentric regions about centerline 208 and/or multiple layers (or levels) at which to dispose magnetic field generators to generate magnetic fields from various positions (e.g., either internal or external to chamber 290). For instance, chamber 290 can be configured to house a shield 292 that includes an inner shield wall 209b and an outer shield wall 211b. Inner shield wall 209b is configured to enclose plasma processing region 205b; and outer shield wall 211b and an inner sidewall 207b of chamber 290 form inner concentric region 203b (i.e., the inner region) therebetween. Outer concentric region 201b (i.e., the outer region) extends externally from an outer sidewall 206b of chamber 290. Thus, one or more magnetic field generators can be disposed within any one or more of regions 201b and 203b. Further, chamber 290 can have multiple layers, each of which can be configured to include one or more magnetic field generators. For example, a group of one or more magnetic field generators can be disposed at layer 270, and another group of one or more magnetic field generators can be disposed at layer 272. Layer 272 can be at distance 260 as a reference from layer 270, the surface of substrate 250, the bottom wall of chamber 290, or any other point of reference from which to describe a layer of magnetic field generators. Note that top view 202 depicts an outer concentric region 201a, a processing region 205a, and an inner concentric region 203a corresponding to outer concentric region 201b, processing region 205b, and inner concentric region 203b of side view 220, respectively. Note, too, an outer shield wall 211a and an inner sidewall 207a can correspond respectively to outer shield wall 211b and inner sidewall 207b of chamber 290 in side view 220. While the plasma implementation system is symmetrical in structure in some embodiments, such that outer concentric region 201b and inner concentric region 203b of side view 220 being symmetric about centerline 208, the plasma implementation system need not be symmetrical in structure. Note that centerline 208 need not be straight and can be curved or can include a turn. Note, too, that centerline 208 can be oriented at 90 degrees (or any amount of degrees) from the position shown in FIG. 2.

In view of the foregoing, magnetic field generators can be disposed at multiple layers, thereby applying magnetic field at various layers along centerline 208 within and between chamber portions 280 and 282. In some embodiments, magnetic field generators can generate magnetic field magnitudes extending adjacent to or including centerline in layers 270 and 272, where the magnetic field magnitudes are sufficient to increase the uniformity of the deposited non-metal layer. For example, the magnetic field generators can generate sufficient magnetic field magnitudes over a sufficient amount of area over substrate 250 to provide uniform coverage of the layer of non-metal material, thereby reducing deposition non-uniformity across the substrate at exemplary amounts of, for example, less than 3% deviations. In some embodiments, layer 272 (or any other layer) can include magnetic field generators disposed within inner region 203b. As magnetic field magnitudes increase with decreased distances, a magnetic field generator disposed in inner region 203b need not be configured to generate the magnetic fields of a magnetic field generator disposed in outer region 201b. For example, if a magnetic field generator disposed within inner region 203b is a permanent magnet composed of magnetic material, then the amount of magnetic material can be less than that of a permanent magnet disposed in outer region 201b while generating equivalent magnetic field magnitudes at, for example, centerline 208. Or, if the magnetic field generator disposed within inner region 203b is an electro-magnet, then the amount of current (i.e., power) to generate a magnetic field magnitude can be less than that of an electro-magnet disposed in outer region 201b while generating the equivalent magnetic field magnitude. In some embodiments, shield 292 is configured to be replaced after a period of usage. Further, shield 292 can be configured to include outer shield wall 211b that is configured to couple to magnetic field generators. As such, shield 292 can upgrade chamber 290 to include multiple layers of magnetic field generators with relatively minimal effort during routine replacement of the shield.

To perform plasma processing within plasma processing region, chamber 290 includes one or more ports. For example, inlet/outlet port 221a can be configured as an inlet port to introduce a gas (e.g., an inert gas) into chamber 290 for ionization purposes. An example of an inert gas is argon. Inlet/outlet port 221b can be configured as an outlet port to evacuate gaseous byproducts. The plasma implementation system also includes a center magnet field generator ("Magnetic Field Generator") 222 positioned at chamber portion 280 to confront a semiconductor layer on substrate 250. In various embodiments, magnetic field generator 222 can be oriented either internally or externally (not shown) to chamber 290. As used herein, the term "magnetic field generator" can refer, at least in some embodiments, to one or more permanent magnets, electromagnets, or any other structure known to produce magnetic fields. The plasma implementation system can include an orifice configured to accept a wafer chuck 252 that, among other things, supports substrate 250 during plasma processing. Wafer chuck 252 can be configured to receive a biasing signal, such as a radio-frequency ("RF") voltage signal, to facilitate generation of plasma in plasma processing region 205b to perform RF sputtering deposition. In some implementations, wafer chuck 252 can be described as an electrostatic chuck ("ESC") or "e-chuck."

A target 224 is disposed between magnetic field generator 222 and substrate 250. Target 224 can include one or more metal, metalloid, or non-metal elements. An example of a suitable non-metal as a constituent of target 224 is Germanium ("Ge"), and examples of suitable metalloids include Antimony ("Sb") and Tellurium ("Te"). As used herein, the term "non-metal" can refer, at least in some embodiments, to both non-metals and metalloids. In some embodiments, target 224 can include one or more chalcogenide elements. In one embodiment, target 224 can include a material of germanium, antimony and tellurium ("GST") in the form of, for example, $Ge_2Sb_2Te_5$, or any variants thereof. This material can be used to form a layer of GST or other equivalent structures. Note that the plasma implementation system of FIG. 2 can be configured to perform other processing operations other than deposition, such as etching, according to some embodiments.

Figure 3:
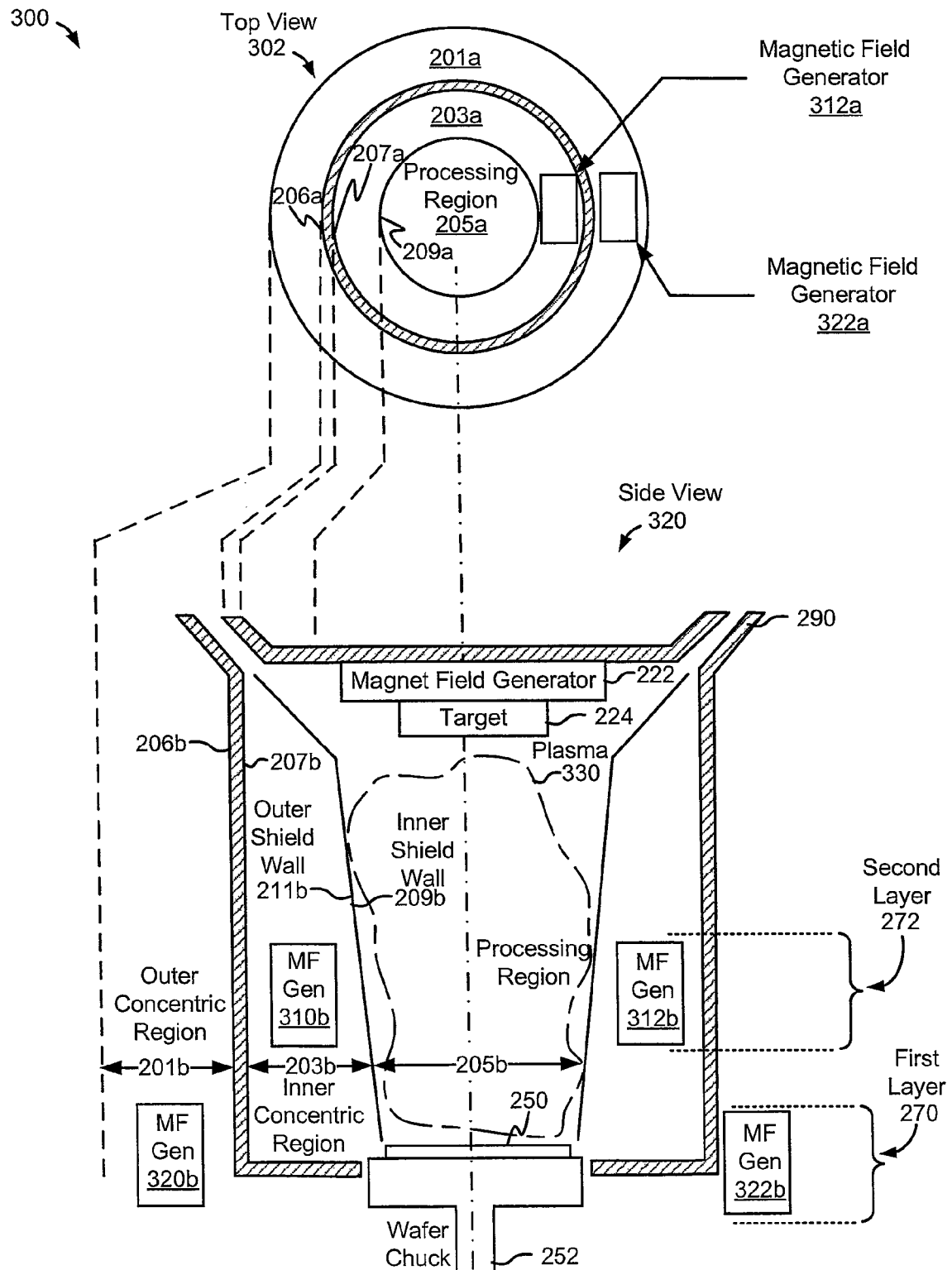
FIG. 3 depicts an example of a system configured to modify a non-metal film on a semiconductor substrate in accordance with at least one embodiment of the invention.

FIG. 3 depicts an example of a system configured to modify a non-metal film on a semiconductor substrate in accordance with at least one embodiment of the invention. Diagram 300 depicts a top view 302 and a side view 320 of a plasma implementation system. In some examples, elements in FIG. 3 can have structures and/or functions equivalent to elements in FIG. 2 that are named and numbered similarly. The example shown in FIG. 3 depicts a plasma implementation system in which two or more sets of magnetic field generators can be disposed either at different distances from center magnetic field generator ("magnetic field generator") 222, or at different radial distances from centerline 208, or both. As shown, one set magnetic field generators, including magnetic field generator ("MF GEN") 320b and magnetic field generator ("MF GEN") 322b, can be disposed in outer region 201b about centerline 208. Further, magnetic field generators 320b and 322b can be positioned in first layer 270. Another set of magnetic field generators, including magnetic field generator 310b and magnetic field generator 312b, can be disposed in inner region 203b about centerline 208. Further, magnetic field generators 310b and 312b can be positioned in second layer 272. Note that top view 302 depicts an arrangement of magnetic field generators 312a and 322a in inner region 201a and outer region 201a, respectively, which correspond to inner region 203b and outer region 201b of side view 320. Note that other magnetic field generators are not shown, but can be disposed at angular distances from magnetic field generators 312a and 322a so that, for example, other magnetic field generators are located 45 degrees from each other relative to centerline 208.

In operation, wafer chuck 252 and magnet field generator 222 of FIG. 3 can collaborate to decompose one or more non-metal materials of target 224 to form a plasma 330 at a plasma processing region 205b adjacent a semiconductor substrate 250 within chamber 290. For example, wafer chuck 252 and magnet field generator 222, along with magnetic field generators disposed about centerline 208, can operate to sputter a chalcogenide material. In some embodiments, wafer chuck 252 can operate as an electrostatic chuck and can receive an RF bias power from 0 to 1,000 Watts, as well as DC power from 100 to 2,500 Watts. Further, wafer chuck 252 can be set to an electrostatic setting, for example, from 0 to 1,500 Volts. Suitable barometric parameters for depositing chalcogenide material include a base pressure less than 5×10−8 Torr and a process pressure of approximately 0.1 to 10 mTorr. Note that any type of DC power can be applied to a plasma implementation system, for example, via wafer chuck 252 and/or pedestal (not shown). For example, the DC power can be applied to the plasma implementation system as a continuous DC signal, or a as pulsed DC signal. In other examples, the DC power can be configured to have any known waveform to facilitate plasma generation.

In some embodiments, magnetic field generators 320b and 322b can be configured to generate a first magnetic field extending over a first radial distance (not shown) to centerline 208, which passes through the approximate center of semiconductor substrate 250. The first magnetic field can have a first magnetic field magnitude at a region about centerline 208. Magnetic field generators 310b and 312b can be configured to generate a second magnetic field extending over a second radial distance to centerline 208. The second magnetic field can have a second magnetic field magnitude that is substantially the same as the first magnetic field magnitude at the region about centerline 208. Plasma 330 can operate to modify a non-metal film upon semiconductor substrate 250 to, for example, deposit a layer of GST ranging from 0 to 5,000 Angstroms.

Figure 4:
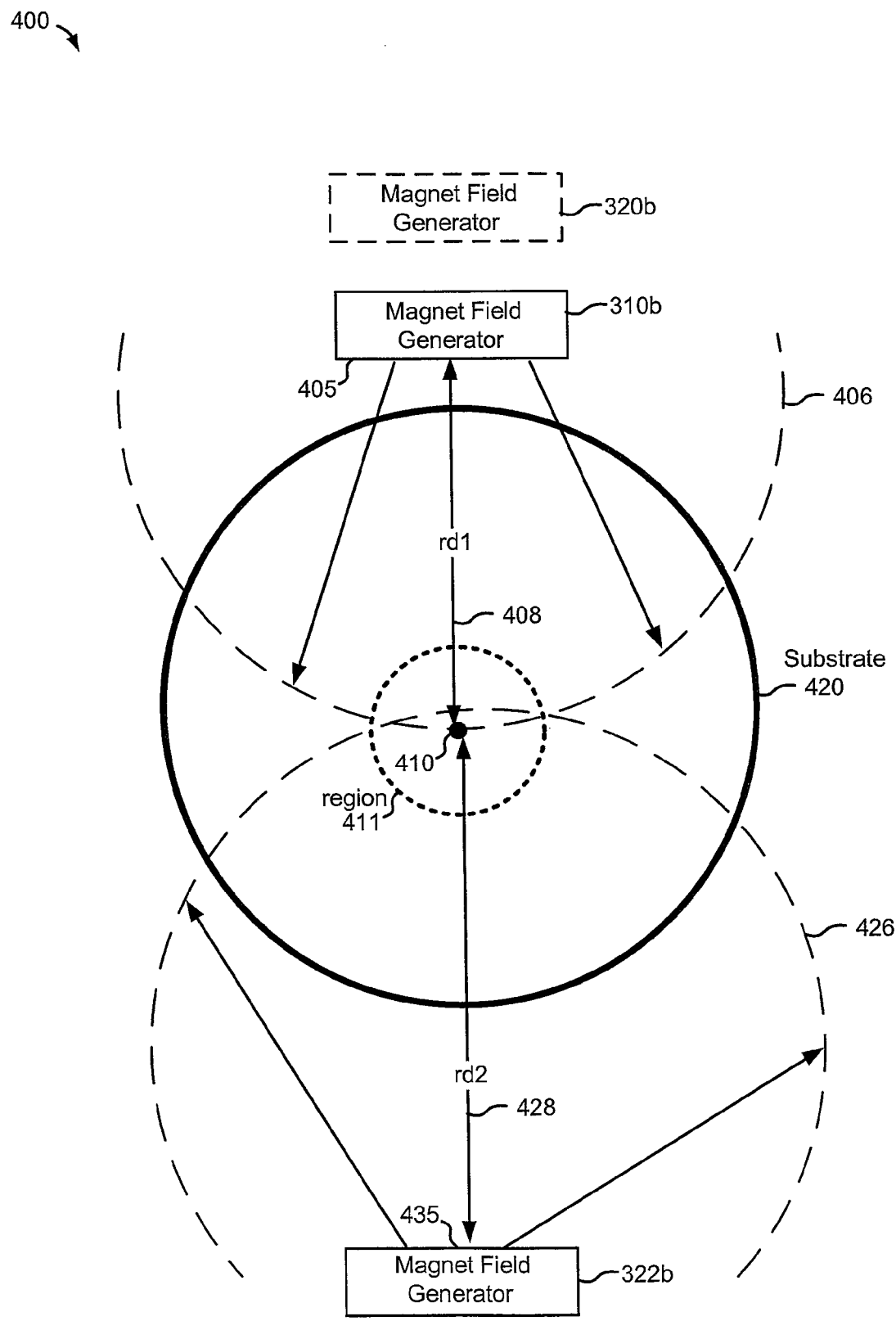
FIG. 4 depicts an example of an arrangement of magnetic field generators configured to generate different magnetic fields in accordance with at least one embodiment of the invention.

FIG. 4 depicts an example of an arrangement of magnetic field generators configured to generate different magnetic fields in accordance with at least one embodiment of the invention. Diagram 400 is a top view of the arrangement of magnetic field generators 310b, 320b and 322b relative a substrate 420 through which a centerline 410 passes. Magnetic field generator 312b of FIG. 3 is not shown. Magnetic field generator 310b is disposed at a radial distance ("rd1") 408 and magnetic field generator 322b is disposed at a radial distance ("rd2") 428, whereby radial distance 408 is less than radial distance 428. As magnetic field generator 310b and magnetic field generator 322b are disposed in a inner region and an outer region, respectively, the magnetic fields of magnetic field generator 310b can be generated in (or emanate from) the inner region and the magnetic fields of magnetic field generator 322b can be generated in (or emanate from) the outer region. In some embodiments, side 405 of magnetic field generator 310b is at radial distance 408 from centerline 208 to confront the plasma processing region over substrate 420, whereas side 435 of magnetic field generator 322b is radial distance 428. In some embodiments, magnetic field generators 310b and 322b can be configured to generate different magnetic fields to compensate for the differences between radial distance 408 and radial distance 428. As the magnitude of a magnetic field varies with distance, the structure and/or functionality of magnetic field generators 310b and 322b can differ so that, for example, magnetic field generator 322b can generate a magnitude for a magnetic field 426 that is equivalent to the magnitude of a magnetic field 406 generated by magnetic field generator 310b. In some cases, magnetic field generators 310b and 322b can be configured to generate equivalent magnitudes of magnetic fields 406 and 426 at centerline 410 or within, for example, a region 411 about centerline 410. In some embodiments, magnetic field generators 310b and 322b can be configured to generate equivalent magnitudes from 0 to 20 Gauss for magnetic fields 406 and 426. In some embodiments, the term "magnitude" of a magnetic field can be used interchangeably with the term "magnetic flux density."

Figure 5:
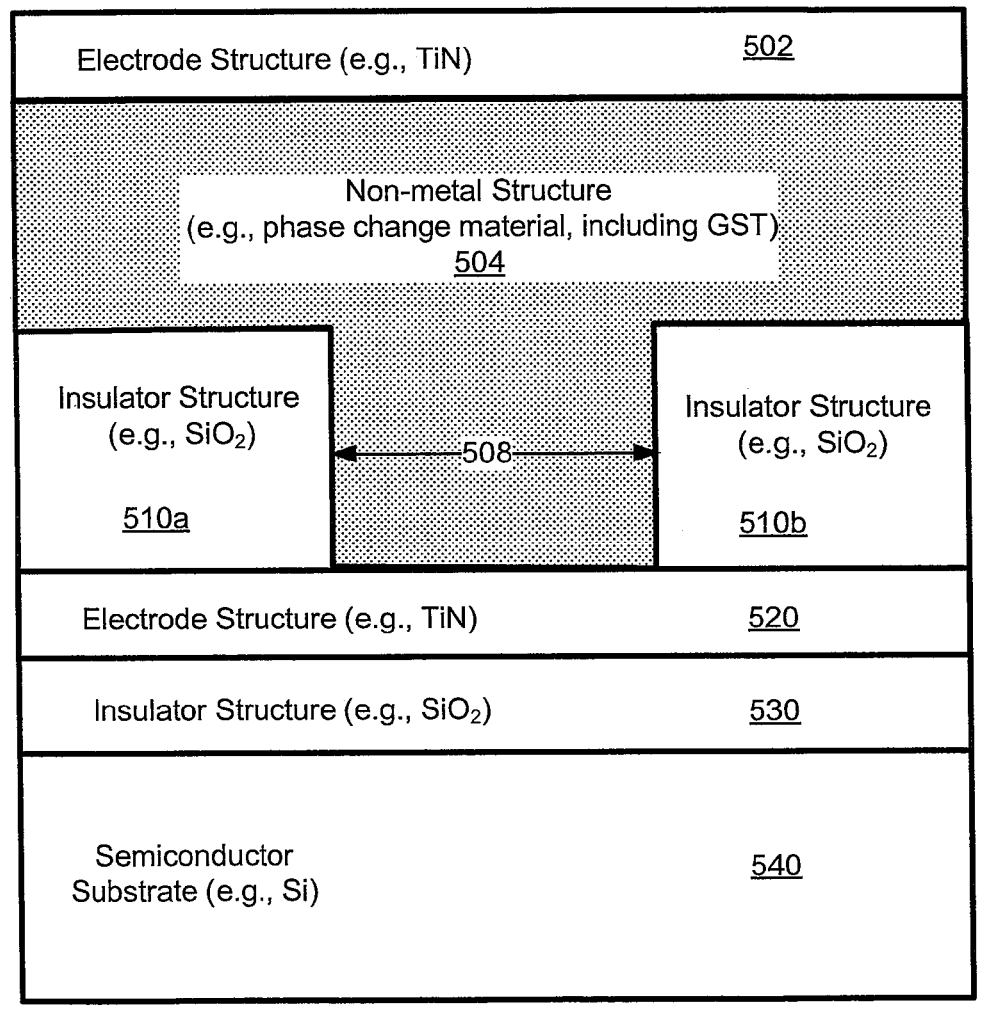
FIG. 5 depicts an example of a memory cell including a layer of chalcogenide-based material as formed by deposition processes and systems in accordance with at least one embodiment of the invention.

FIG. 5 depicts an example of a memory cell including a layer of chalcogenide-based material as formed by deposition processes and systems in accordance with at least one embodiment of the invention. Diagram 500 includes a semiconductor substrate 540, such as a silicon-based substrate, over which an insulator structure 530 is formed. An example of such a structure is a SiO2 structure. On top of insulator structure 530, a bottom electrode structure 520 is formed as a titanium nitride ("TiN")-based or metal-based structure. Upon the bottom electrode structure 520, insulator structures 510a and 510b are formed as, for example, SiO2 structures. A non-metal layer 504, such as a chalcogenide layer, is formed over insulator structures 510a and 510b. In some instances, arrangements of magnetic field generators can reduce or eliminate, for example, voids in area 508, and/or form crystal structure having relatively fewer defects than otherwise might be the case. In some embodiments, non-metal layer 504 includes a material of germanium, antimony and tellurium ("GST") in the form of, for example, $Ge_2Sb_2Te_5$. A top electrode structure 502 can be formed upon non-metal layer 504.

Figure 6A:
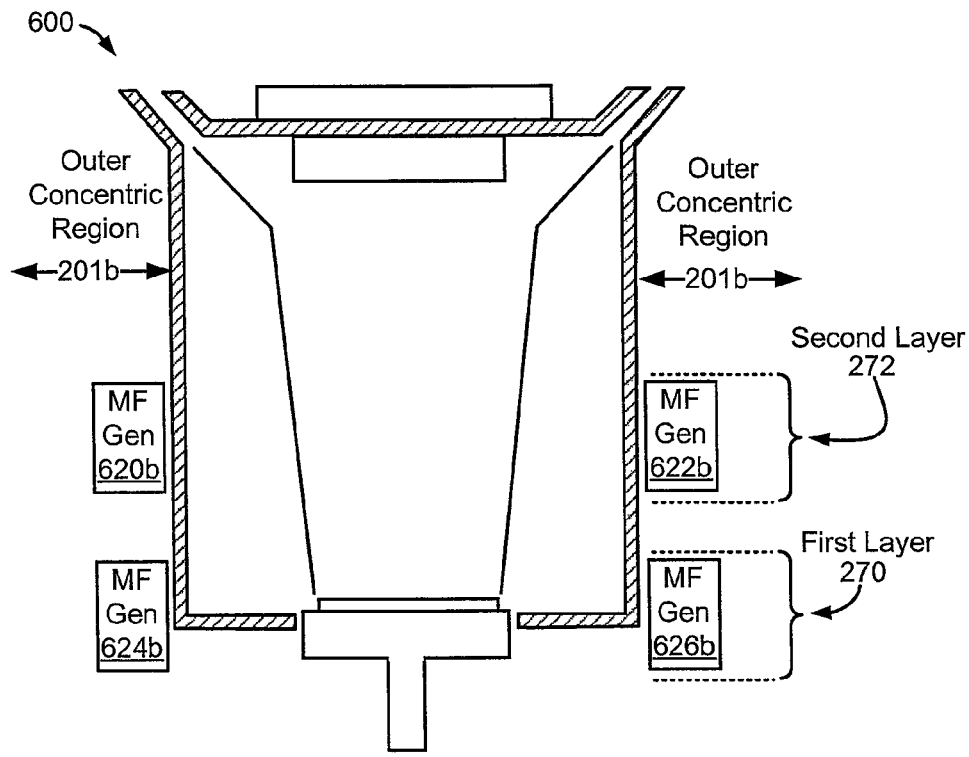
FIGS. 6A and 6B depict other arrangements of magnetic field generators implemented in a plasma implementation system, according to various embodiments of the invention.
Figure 6B:
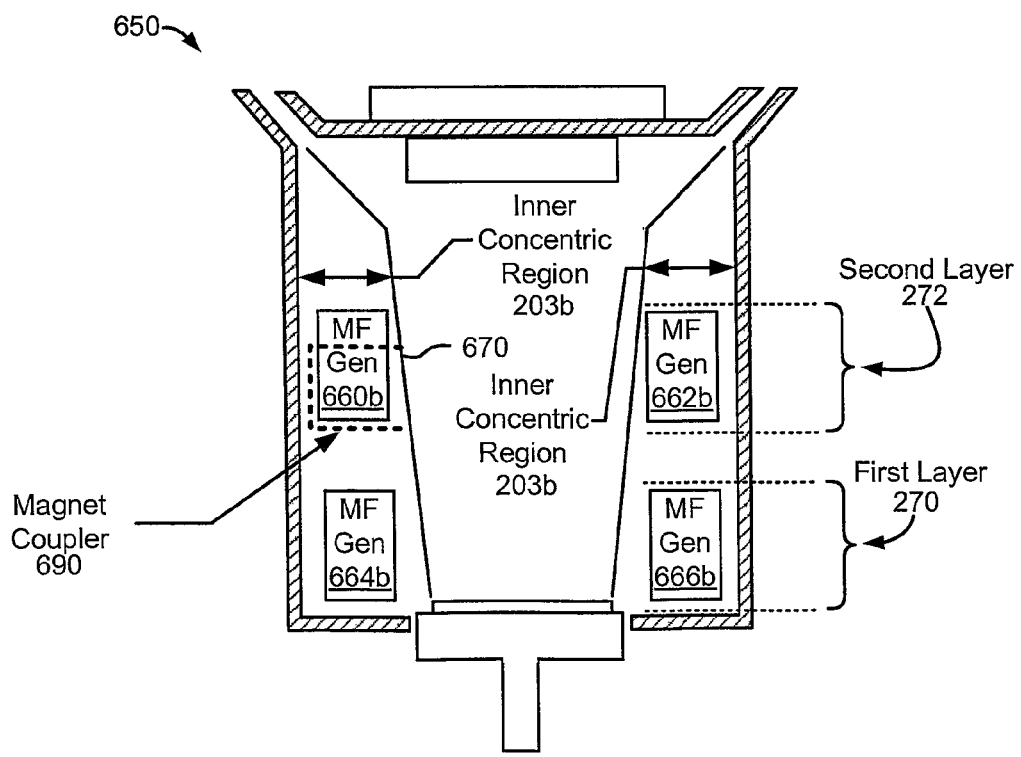

FIGS. 6A and 6B depict other arrangements of magnetic field generators implemented in a plasma implementation system, according to various embodiments of the invention. FIG. 6A illustrates a plasma implementation system including an arrangement of magnetic field generators in which magnetic field generators 620b and 622b are disposed in outer region 201b at a second layer 272, and magnetic field generators 624b and 626b are disposed in outer region 201b at a first layer 270. FIG. 6B illustrates a plasma implementation system including another arrangement of magnetic field generators in which magnetic field generators 660b and 662b are disposed in inner region 203b at second layer 272, and magnetic field generators 664b and 666b are disposed in inner region 203b at first layer 270. Further, one or more of magnetic field generators 660b, 662b, 664b and 666b can be coupled via magnet coupler 690 to a shield 670. In various embodiments, magnet coupler 690 can be a structure configured to hold a magnetic field generator to reuse the magnetic field generator when replacing shield 670 with another shield.

Figure 7:
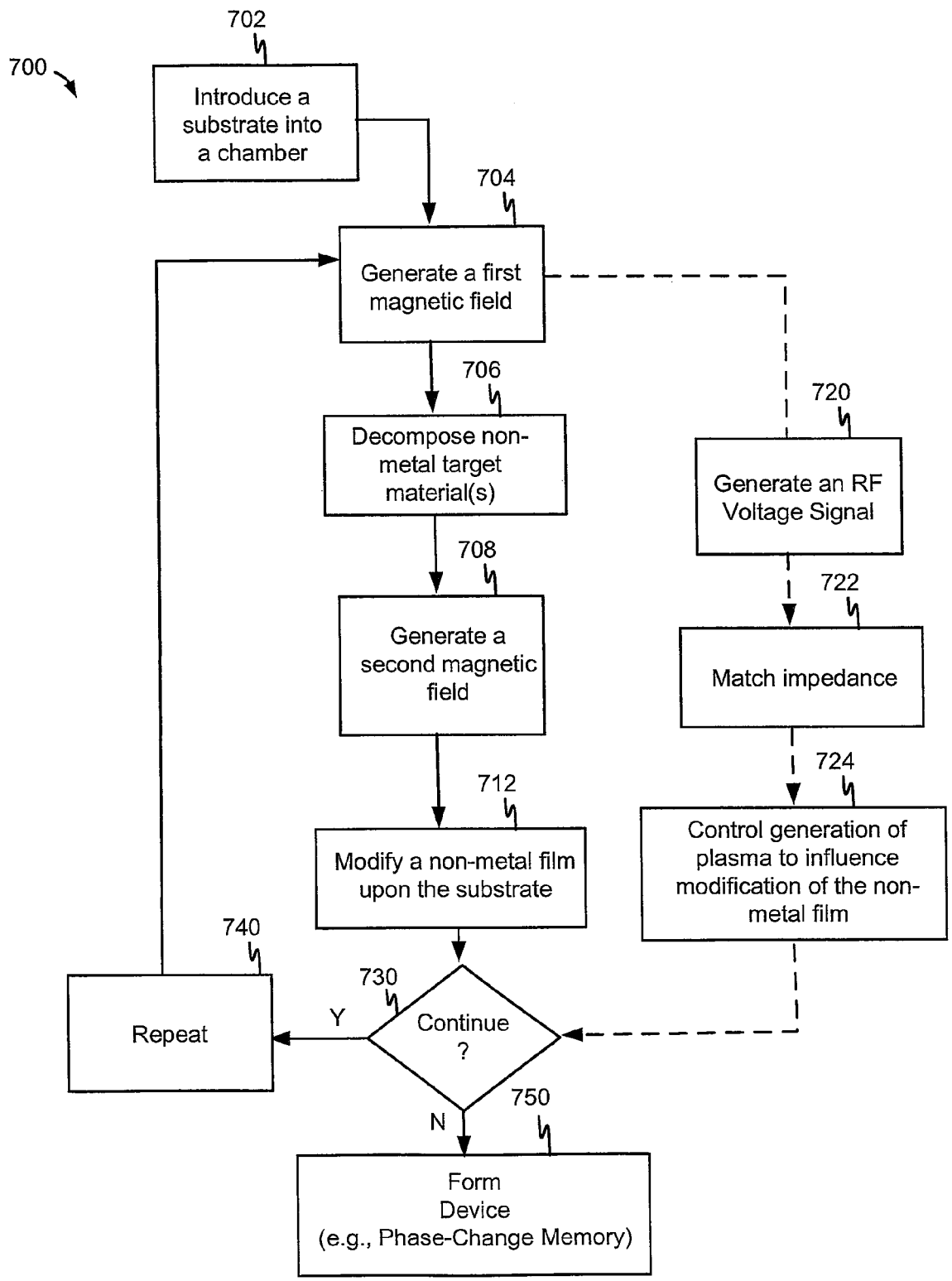
FIG. 7 is an example of a flow chart depicting a process by which to modify a non-metal film on a substrate, according to an embodiment of the invention.

FIG. 7 is an example of a flow chart depicting a process by which to modify a non-metal film on a substrate, according to an embodiment of the invention. In flow 700, a substrate is introduced into a chamber at 702. At 704, a first magnetic field is generated. At 706, a non-metal material is decomposed to form a non-metal layer, such as a layer of GeSbTe, AgInSbTe, or any other suitable chalcogenide composed of at least one chalcogen ion. At 708, a a second magnetic field is generated. At 712, a non-metal film on a substrate is modified. In parallel or concurrent with 704 to 712, an RF voltage signal is generated at 720. The impedance of a source of the RF voltage signal is matched at 722. At 724, the generation of plasma is controlled to modify the non-metal film. At 730 a decision is made whether to continue. If so, then flow 700 moves to 740 to repeat, but if not, then flow 700 ends at 750 to form the non-metal layer for a device, such as a phase-change memory device. Note that while 720, 722, and 724 are depicted as parallel in this example, one or more of 720, 722, and 724 can be anywhere in series with one or more of 704, 706, 708, 712, 730, 740, and 750 in other examples.

Figure 8:
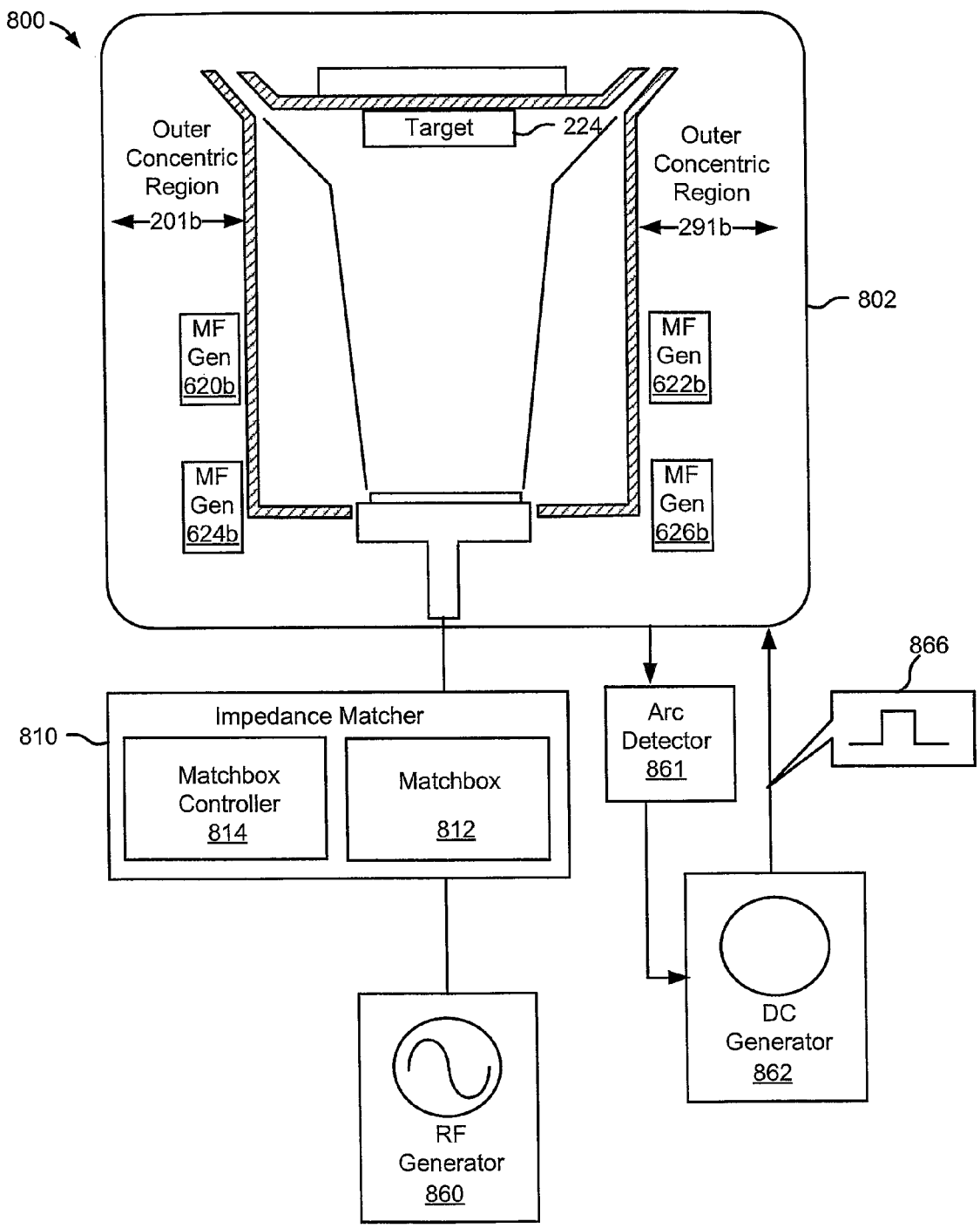
FIG. 8 is an example of an impedance matcher configured to control the modification of a non-metal film on a substrate, according to an embodiment of the invention.

FIG. 8 is an example of an impedance matcher configured to control the modification of a non-metal film on a substrate, according to an embodiment of the invention. Diagram 800 illustrates that a plasma implementation system 802, which is similar to the system of FIG. 6B, is coupled to an impedance matcher 810. Impedance matcher 810 is configured to match the impedance of an RF generator 860 and a plasma including GST so as to effect minimal wave reflection and/or maximum power transfer (i.e., optimal power dissipation). Impedance matcher 810 includes a matchbox 812 and a matchbox controller 814. Matchbox 812 is configured to match impedances between a plasma including germanium, antimony and tellurium ("GST") and the RF generator 860, whereas matchbox controller 814 can be configured to control the generation of the RF voltage to facilitate generation of the plasma to modify the non-metal film, thereby depositing one or more layers of GST.

Diagram 800 also illustrates that plasma implementation system 802 is configured to operate in association with a direct current ("DC") generator 862 configured to generate a DC power signal to, for example, provide DC power to target 224. In some embodiments, the DC power signal can be applied as a pulsed DC signal 866 to target 224. In at least one example, target 224 includes GST. DC power generator 862 is shown to be coupled to an arc detector 861, which is configured to detect an eminent arc that might otherwise damage target 224 and prevent the arc from contacting target 224. For example, arc detector 861 can detect an arc and transmit a signal to DC power generator 862 to reverse the polarity of pulsed DC signal 866, thereby preventing damage to target 224 (or at least reducing the effects of the arc).

Figure 9:
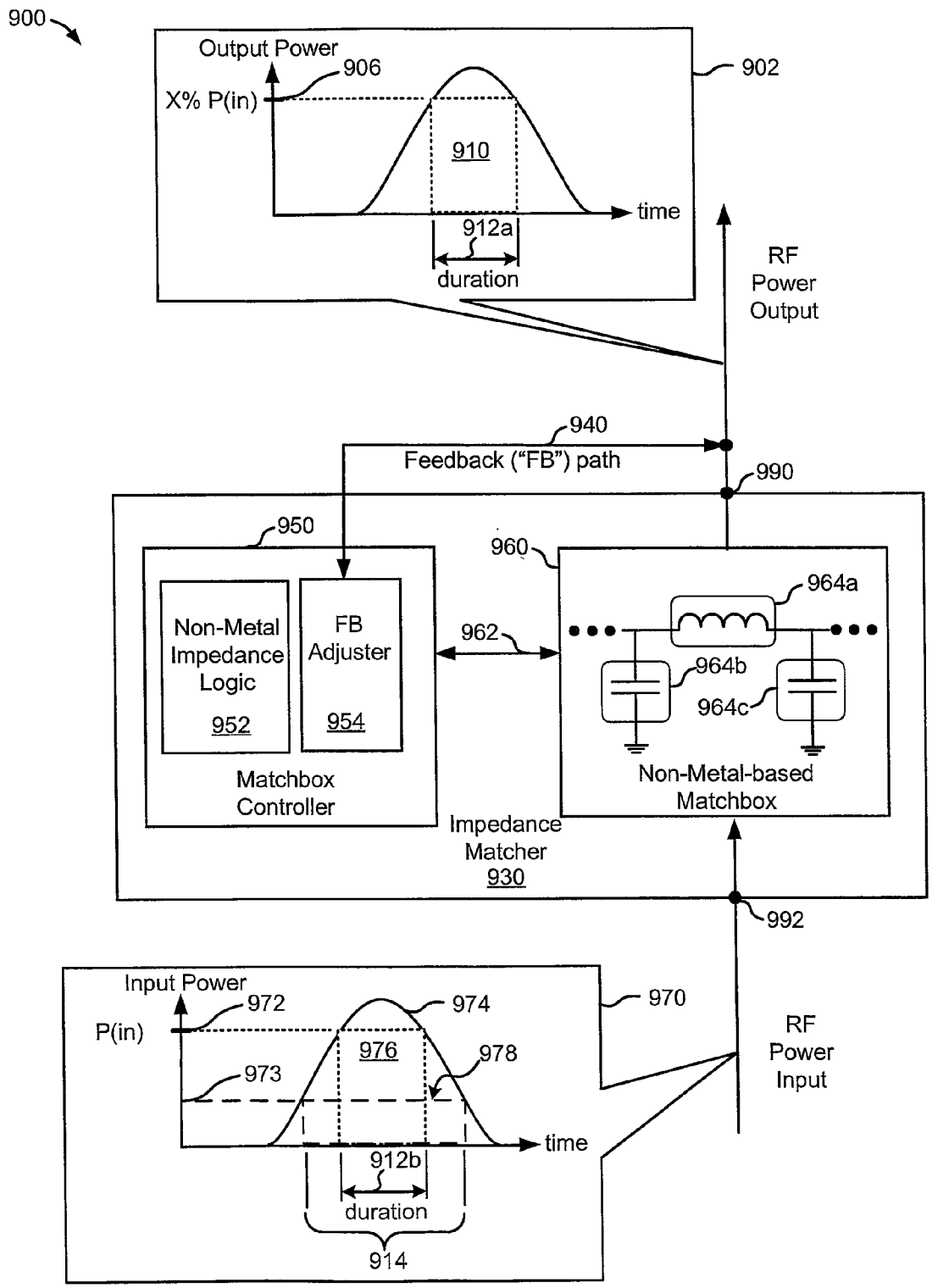
FIG. 9 is an example of an impedance matcher configured to control power for purposes of generating a plasma to modify a non-metal film on a substrate, according to an embodiment of the invention.

FIG. 9 is an example of an impedance matcher configured to control power for purposes of generating a plasma to modify a non-metal film on a substrate, according to an embodiment of the invention. Diagram 900 illustrates an impedance matcher 930 including a matchbox controller 950 and a non-metal-based matchbox 960. In specific embodiments, matchbox controller 950 is configured to match impedances for values of RF power applied to input terminal 992 and/or for values of RF power from output terminal 990. Output terminal is used to deliver the RF output power to a plasma implementation system for generating a plasma that includes non-metal elements, such as the elements of germanium, antimony and tellurium ("GST"). Impedance matcher 930 also can be configured to reduce reflected power and to enhance power transfer efficiencies of non-metal-based matchbox 960, among other things. To illustrate, consider that generating a plasma including non-metal elements uses an amount 976 of input power for an interval of time, amount 976 being represented by an area under a power curve that defines amounts 976 and 978, which are equivalent, to effect deposition using a non-metal target material. Note that impedance matcher 930 can accept an input power value of 973 to deliver amount 978 over an interval 914 of time. However, interval 914 of time increases processing time, and thus reduces deposition throughput. As such, impedance matcher 930 can be configured to accept an input power value of 972 ("P(in)") to deliver amount 976 over duration 912b, which is less than interval 914.

In some embodiments, non-metal-based matchbox 960 is configured to match an impedance associated with a plasma including GST, and matchbox controller 950 is configured to modify the functionality of non-metal-based matchbox 960 to match impedances over a range of values of input power applied for duration 912b of time to a plasma implementation system. An example of a range of input power includes values from 0 to 1,000 Watts (e.g., for RF bias power). An example of a duration 912b is an amount of time between 45 seconds and 360 seconds during which one or more values of input power (including value 972) are applied to non-metal-based matchbox 960. Impedance matcher 930 can be configured to generate an RF output power signal at terminal 990 for delivery to a plasma implementation system. An example of a value of output power is value 906, as shown in relationship 902. In some embodiments, value 906 is approximately "X" percentage of the input power value 972.

In operation, matchbox controller 950 is configured to control (e.g., via control signals via path 962) non-metal-based matchbox 960 to optimize the value of "X" percentage to be above, for example, 80%. In some embodiments, optimizing the value of "X" percentage increases power transfer efficiencies, which, in turn, decreases power losses that often contribute to thermal energy (i.e., increased temperatures). In some instances, increased temperatures can degrade performance of impedance matcher 930 or a component used in the plasma-generation process. Therefore, matchbox controller 950 can be configured to ensure non-metal-based matchbox 960 operates to match impedances of plasmas including non-metal elements that otherwise might be the case.

In some embodiments, non-metal-based matchbox 960 includes impedance-matching devices 964, such as capacitors 964b and 964c and inductor 964a. In some instances, one or more of impedance-matching devices 964 can have programmable functionality (e.g., variable inductances, variable capacitances, variable resistances, or the like) that are modified by matchbox controller 950. Matchbox controller 954 can include a feedback ("FB") adjuster 954 to receive feedback information via feedback path ("FB") 940, and adjust operation of one or more impedance matching devices 964 to regulate value 906 of the output power. In at least one embodiment, matchbox controller 950 can include non-metal impedance logic 952 configured to, among other things, regulate operation of non-metal-based matchbox 960 to maintain power transfer efficiencies above a threshold (e.g., above 90% efficiency) to keep duration 912a equivalent to (or at least from diverging from) duration 912b. Thus, an amount 910 can be used to generate a plasma for depositing non-metal layers, such as GST, on a substrate.

In at least some of the embodiments of the invention, one or more of the structures and/or functions of any of the above-described features can be implemented in software, hardware (e.g., including a computer, a processor, a memory, logic, or the like), firmware, circuitry, or a combination thereof. Note that the structures and constituent elements above, as well as their functionality, can be aggregated with one or more other structures or elements. Alternatively, the elements and their functionality can be subdivided into constituent sub-elements, if any.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments.

Thus, the foregoing descriptions of specific embodiments of the invention are presented for purposes of illustration and description. They are not intended to be exhaustive or to limit the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments can be modified within the scope and equivalents of the appended claims. Further, the embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

The invention claimed is:

1. A method to operate a plasma implementation system to process a semiconductor substrate comprising:
    implementing a top magnet at a top chamber portion internal to a chamber, the top magnet configured to sputter a chalcogenide-based target material to form a plasma at a plasma processing region at a bottom chamber portion including a semiconductor substrate within the chamber;
    enclosing the plasma processing region with a shield having an outer shield wall, an outer region and an inner region being disposed concentrically about the outer shield wall;
    implementing a first set of a plurality of separate magnetic field generators disposed radially about a centerline that passes through the center of the bottom chamber portion configured to include the semiconductor substrate, the first set of the plurality of the separate magnetic field generators in a first plane at a first radial distance;
    orienting the first set of the plurality of separate magnetic field generators to generate at least a portion of a first magnetic field that originates from the first plane at the first radial distance that is substantially orthogonal to the centerline, the portion of the first magnetic field having a first magnetic field magnitude at a region about the centerline, the first plane being disposed either between the top magnet at the top chamber portion and the bottom chamber portion that is configured to include the semiconductor substrate, or at a distance from the top magnet in which the first plane includes the bottom chamber portion that is configured to include the semiconductor substrate;
    implementing a second set of a plurality of separate magnetic field generators disposed radially about the centerline in a second plane at a second radial distance;
    orienting the second set of the plurality of separate magnetic field generators to generate at least a portion of a second magnetic field that originates from the second plane at the second radial distance that is substantially orthogonal to the centerline, the portion of the second magnetic field having a second magnetic field magnitude substantially the same as the first magnetic field magnitude at the region about the centerline, the second plane being disposed either between the top magnet at the top chamber portion and the bottom chamber portion that is configured to include the semiconductor substrate, or at a distance from the top magnet in which the second plane includes the bottom chamber portion that is configured to include the semiconductor substrate,
    wherein the first radial distance is different from the second radial distance; and
    implementing an impedance matcher to generate a radio-frequency ("RF") voltage signal to supply RF power and to match impedance between the plasma and a source generating the RF voltage to control the deposition of a layer of nonmetal film as a chalcogenide-based film upon the semiconductor substrate,
    wherein the first radial distance and the second radial distance are greater than a radial distance at which a wall of a shield is disposed,
    wherein generating the first magnetic field and generating the second magnetic field respectively comprise:
        originating the first magnetic field at one of the outer region and the inner region; and
        originating the second magnetic field at the other of the outer region and the inner region, the outer region being external to an outer sidewall of the chamber and the inner region being internal within the chamber.

2. The method of claim 1 further comprising:
sputtering the chalcogenide-based target material.

3. The method of claim 1 further comprising:
modifying a non-metal film by depositing one or more layers including germanium, antimony and tellurium ("GST") on the semiconductor substrate.

4. The method of claim 1 further comprising:
sputtering the chalcogenide-based target material including germanium, antimony and tellurium ("GST") in the form: $Ge_2Sb_2Te_5$.

5. The method of claim 1 further comprising:
depositing a layer including germanium, antimony and tellurium ("GST") in the form: $Ge_2Sb_2Te_5$.

6. The method of claim 1 further comprising:
integrating magnet couplers with the outer shield wall of the shield, the magnet couplers each configured to hold a magnetic field generator;
implementing a first subset of a plurality of separate magnets as the first set of the plurality of separate magnetic field generators and
implementing a second subset of a plurality of separate magnets as the second set of the plurality of separate magnetic field generators.

7. The method of claim 6 further comprising applying the RF voltage in intervals of time ranging from 120 seconds to 300 seconds.

8. The method of claim 6 further comprising:
disposing either the first subset of the plurality of separate magnets or the second subset of the plurality of separate magnets in the magnet couplers, wherein the magnet couplers are positioned in an inner region between the outer shield wall and an inner sidewall of the chamber.

9. The method of claim 6 further comprising:

replacing the shield with another shield that includes other magnet couplers; and reusing either the first subset of the plurality of separate magnets or the second subset of the plurality of separate magnets by placing them in the other magnet couplers.

* * * * *